United States Patent
Oh et al.

(10) Patent No.: US 9,142,747 B2
(45) Date of Patent: Sep. 22, 2015

(54) LIGHT EMITTING DEVICE PACKAGE AND BACKLIGHT UNIT COMPRISING THE SAME

(71) Applicant: LUMENS CO., LTD., Gyeonggi-do (KR)

(72) Inventors: Seung Hyun Oh, Gyeonggi-do (KR); Pyoung Gug Kim, Gyeonggi-do (KR); Seung Hoon Lee, Gyeonggi-do (KR); Chun Ki Min, Gyeonggi-do (KR); Jung A Lim, Seoul (KR); Jun Hyung Lim, Seoul (KR); Cheol Hun Jung, Gyeonggi-do (KR); Bo Hyun Chung, Seoul (KR)

(73) Assignee: LUMENS CO., LTD., Yongin-so, Gyeonggi-do (KR)

( * ) Notice: Subject to any disclaimer, the term of this patent is extended or adjusted under 35 U.S.C. 154(b) by 0 days.

(21) Appl. No.: 14/358,994

(22) PCT Filed: Nov. 16, 2012

(86) PCT No.: PCT/KR2012/009752
§ 371 (c)(1),
(2) Date: May 16, 2014

(87) PCT Pub. No.: WO2013/073897
PCT Pub. Date: May 23, 2013

(65) Prior Publication Data
US 2014/0328083 A1    Nov. 6, 2014

(30) Foreign Application Priority Data

Nov. 17, 2011   (KR) .................. 10-2011-0120496
Sep. 4, 2012    (KR) .................. 10-2012-0097844

(51) Int. Cl.
*H01L 33/48*     (2010.01)
*H01L 33/54*     (2010.01)
(Continued)

(52) U.S. Cl.
CPC .............. *H01L 33/62* (2013.01); *H01L 33/486* (2013.01); *H01L 33/54* (2013.01); *H01L 33/60* (2013.01);
(Continued)

(58) Field of Classification Search
CPC ........................................ H01L 33/48–33/644
See application file for complete search history.

(56) References Cited

U.S. PATENT DOCUMENTS 6,573,653 B1 *  6/2003  Ishinaga ...................... 313/512
6,700,137 B2 *  3/2004  Horiuchi et al. ............... 257/81
(Continued)

FOREIGN PATENT DOCUMENTS

KR    20070056233 A     6/2007
KR    1020070056230 A   6/2007
(Continued)

OTHER PUBLICATIONS

International Search Report mailed Apr. 16, 2013; PCT/KR2012/009752.

*Primary Examiner* — Laura Menz
*Assistant Examiner* — Maliheh Malek
(74) *Attorney, Agent, or Firm* — Ladas & Parry LLP

(57) ABSTRACT

Disclosed is a light emitting element package having excellent heat radiation performance and high luminance, and a backlight unit including the same. The light emitting element package includes a package including a lead frame, a light emitting element provided on the lead frame, and a molded material combined with the lead frame and having an opening for emitting light generated by the light emitting element, and a reflection structure having an opening corresponding to the opening of the molded material, and contacting the molded material.

15 Claims, 9 Drawing Sheets

(51) Int. Cl.
*H01L 33/60* (2010.01)
*H01L 33/62* (2010.01)
*F21V 8/00* (2006.01)
*G02F 1/1335* (2006.01)

(52) U.S. Cl.
CPC ............ *G02B 6/0031* (2013.01); *G02B 6/0073* (2013.01); *G02B 6/0085* (2013.01); *G02F 1/133615* (2013.01); *G02F 2001/133614* (2013.01); *H01L 2224/48091* (2013.01); *H01L 2224/48247* (2013.01)

(56) References Cited

U.S. PATENT DOCUMENTS

| | | | |
|---|---|---|---|
| 6,791,116 B2 * | 9/2004 | Hirano et al. | 257/79 |
| 6,897,490 B2 * | 5/2005 | Brunner et al. | 257/98 |
| 7,518,155 B2 * | 4/2009 | Ishidu et al. | 257/98 |
| 7,718,456 B2 * | 5/2010 | Maeda et al. | 438/40 |
| 7,737,463 B2 * | 6/2010 | Lee et al. | 257/99 |
| 7,830,079 B2 * | 11/2010 | Tamaki et al. | 313/498 |
| 8,029,152 B2 * | 10/2011 | Sekine et al. | 362/84 |
| 8,044,412 B2 * | 10/2011 | Murphy et al. | 257/81 |
| 8,197,097 B2 * | 6/2012 | Ogawa et al. | 362/294 |
| 8,231,251 B2 * | 7/2012 | Eng et al. | 362/346 |
| 8,354,745 B2 * | 1/2013 | Lee et al. | 257/686 |
| 8,664,538 B2 * | 3/2014 | Kim | 174/260 |
| 2002/0024808 A1 * | 2/2002 | Suehiro et al. | 362/245 |
| 2002/0085390 A1 * | 7/2002 | Kiyomoto et al. | 362/555 |
| 2002/0134988 A1 * | 9/2002 | Ishinaga | 257/99 |
| 2002/0163006 A1 * | 11/2002 | Yoganandan et al. | 257/81 |
| 2003/0067264 A1 * | 4/2003 | Takekuma | 313/501 |
| 2004/0061433 A1 * | 4/2004 | Izuno et al. | 313/498 |
| 2004/0076016 A1 * | 4/2004 | Sato et al. | 362/555 |
| 2004/0208210 A1 * | 10/2004 | Inoguchi | 372/36 |
| 2004/0211970 A1 * | 10/2004 | Hayashimoto et al. | 257/98 |
| 2005/0133808 A1 * | 6/2005 | Uraya et al. | 257/99 |
| 2006/0102917 A1 * | 5/2006 | Oyama et al. | 257/99 |
| 2006/0138937 A1 * | 6/2006 | Ibbetson | 313/502 |
| 2006/0152820 A1 * | 7/2006 | Lien et al. | 359/726 |
| 2006/0157722 A1 * | 7/2006 | Takezawa et al. | 257/98 |
| 2007/0145401 A1 * | 6/2007 | Ikehara | 257/98 |
| 2008/0023721 A1 * | 1/2008 | Lee et al. | 257/99 |
| 2008/0037252 A1 * | 2/2008 | Nii et al. | 362/267 |
| 2008/0054288 A1 * | 3/2008 | Harrah et al. | 257/99 |
| 2008/0224161 A1 * | 9/2008 | Takada | 257/98 |
| 2009/0046456 A1 * | 2/2009 | Urano et al. | 362/235 |
| 2009/0103005 A1 * | 4/2009 | Nakazato et al. | 349/62 |
| 2009/0147498 A1 * | 6/2009 | Park | 362/84 |
| 2009/0201440 A1 * | 8/2009 | Hamada | 349/61 |
| 2009/0230417 A1 * | 9/2009 | Tsai et al. | 257/98 |
| 2009/0243458 A1 * | 10/2009 | Lee | 313/45 |
| 2009/0296367 A1 * | 12/2009 | Sekine et al. | 362/84 |
| 2009/0303728 A1 * | 12/2009 | Ueji et al. | 362/296.01 |
| 2010/0002455 A1 * | 1/2010 | Matsuoka et al. | 362/382 |
| 2010/0072499 A1 * | 3/2010 | Kwon et al. | 257/98 |
| 2010/0133565 A1 * | 6/2010 | Cho et al. | 257/98 |
| 2010/0163898 A1 * | 7/2010 | Hung et al. | 257/98 |
| 2010/0193821 A1 * | 8/2010 | Fukasawa et al. | 257/98 |
| 2010/0314654 A1 * | 12/2010 | Hayashi | 257/99 |
| 2011/0039978 A1 * | 2/2011 | Kotani et al. | 523/218 |
| 2011/0049550 A1 * | 3/2011 | Katsuno et al. | 257/98 |
| 2011/0065241 A1 * | 3/2011 | Lin et al. | 438/118 |
| 2011/0114979 A1 * | 5/2011 | Jang | 257/98 |
| 2011/0180832 A1 * | 7/2011 | Kim | 257/98 |
| 2011/0220926 A1 * | 9/2011 | Kim | 257/91 |
| 2012/0018772 A1 * | 1/2012 | Nishijima et al. | 257/99 |
| 2012/0057099 A1 * | 3/2012 | Tanuma et al. | 349/62 |
| 2012/0153326 A1 * | 6/2012 | Wang et al. | 257/98 |
| 2012/0161186 A1 * | 6/2012 | Katabe et al. | 257/98 |
| 2012/0205693 A1 * | 8/2012 | Ong et al. | 257/98 |
| 2013/0010495 A1 * | 1/2013 | Moon et al. | 362/609 |
| 2013/0169149 A1 * | 7/2013 | Sato et al. | 313/512 |
| 2013/0170208 A1 * | 7/2013 | Kuwaharada et al. | 362/243 |
| 2015/0008455 A1 * | 1/2015 | Tozawa et al. | 257/88 |

FOREIGN PATENT DOCUMENTS

| | | |
|---|---|---|
| KR | 20100058978 A | 6/2010 |
| KR | 1020100119513 A | 11/2010 |
| KR | 1020110007633 A | 1/2011 |
| KR | 1020110112539 A | 10/2011 |

\* cited by examiner

LIGHT EMITTING DEVICE PACKAGE AND BACKLIGHT UNIT COMPRISING THE SAME

TECHNICAL FIELD

The present invention relates to a light emitting element package and a backlight unit including the same. More particularly, the present invention relates to a light emitting element package having excellent heat radiation performance and high luminance, and a backlight unit including the same.

BACKGROUND ART

In general, a light emitting element is used as a light source of a backlight unit in an electronic device, e.g., display device. A light emitting element may be packaged in various ways before being connected to a backlight module and a backlight unit includes a packaged light emitting element.

The light emitting element of the light emitting element package generates not only light but also a considerable amount of heat.

DETAILED DESCRIPTION OF THE INVENTION

Technical Problem

However, in the above-described conventional light emitting element package, heat generated by the light emitting element may not be easily discharged to the outside. As a result, a molded material may inflate or the life span of the light emitting element may be shortened.

The present invention has been made in an effort to solve various problems including the above problem, and provides a light emitting element package having excellent heat radiation performance and high luminance, and a backlight unit including the same. However, the scope of the present invention is not limited thereto.

Technical Solution

According to an aspect of the present invention, there is provided a light emitting element package including a lead frame, a light emitting element on the lead frame, a molded material combined with the lead frame and having an opening for emitting light generated by the light emitting element, and a reflection structure having an opening that corresponds to the opening of the molded material, and contacting the molded material.

The reflection structure may include a supporting portion contacting the molded material and provided continuously or discretely along a circumference of the opening of the molded material, and a radial portion contacting the supporting portion and extending radially from the molded material relative to a direction along which light generated by the light emitting element emits.

The molded material may include a supporting portion provided continuously or discretely along a circumference of the opening of the molded material, and the reflection structure may include a radial portion contacting the supporting portion and having a radial shape extending radially from the molded material relative to a direction along which light generated by the light emitting element emits.

The molded material may include a supporting portion provided continuously or discretely along a circumference of the opening of the molded material, and the reflection structure may have a shape that corresponds to the supporting portion of the molded material and contact the molded material.

Recesses or concave and convex portions may be provided on the molded material, and the reflection structure may be fitted into the recesses or concave and convex portions.

The light emitting element package may further include an adhesive layer provided in at least part of a region between the molded material and the reflection structure to fix the reflection structure onto the molded material.

The adhesive layer may have a first thickness in an area adjacent to the light emitting element and a second thickness in an area away from the light emitting element, and the first thickness may be greater than the second thickness.

The thickness of the adhesive layer may be gradually reduced away from the light emitting element.

The reflection structure may include a radial surface formed in a radial shape extending radially from the molded material relative to a direction along which light generated by the light emitting element emits.

The radial surface of the reflection structure may form a predetermined angle with a main emission direction of light generated by the light emitting element emits.

The predetermined angle may be equal to or greater than 10° and equal to or less than 20°.

The radial surface of the reflection structure may form a first angle with to a main emission direction of light generated by the light emitting element, from a point where the radial surface contacts the molded material to a first point away from the molded material, and form a second angle with the main emission direction from the first point to a second point further away from the molded material compared to the first point, and the second angle may be greater than the first angle.

The light emitting element package may further include a first resin layer that includes a fluorescent material and be provided in the opening of the molded material to cover the light emitting element.

The light emitting element package may further include a light-transmitting second resin layer that covers the first resin layer and contacts the radial surface.

The light emitting element package may further include a light-transmitting second resin layer provided in the opening of the molded material to cover the light emitting element, and a first resin layer that includes a fluorescent material, covers the second resin layer, and contacts the radial surface.

The reflection structure may comprise metal.

A surface of the supporting portion facing the opening of the molded material may have a radial shape extending radially relative to a direction along which light generated by the light emitting element emits.

Part of the reflection structure may be inserted into the opening of the molded material, and the other part of the reflection structure, protruding from the opening of the molded material may have a radial shape extending radially from the molded material relative to a direction along which light generated by the light emitting element emits.

According to another aspect of the present invention, there is provided a light emitting element package including a lead frame, a light emitting element on the lead frame, a molded material combined with the lead frame and having an opening for emitting light generated by the light emitting element, a reflection structure having an opening that corresponds to the opening of the molded material, and contacting the molded material, a supporting portion provided discretely or continuously on the molded material to fix the reflection structure onto the molded material, and an adhesive layer provided in at least part of a region between the molded material and the reflection structure, and having a first thickness in an area adjacent to the light emitting element and a second thickness in an area away from the light emitting element, wherein the first thickness is greater than the second thickness.

According to yet another aspect of the present invention, there is provided a backlight unit including a reflective sheet, a light guide plate on or above the reflective sheet, and a light emitting element package configured to illuminate the light guide plate.

Advantageous Effects

According to an embodiment of the present invention, a light emitting element package having excellent heat radiation performance and high luminance, and a backlight unit including the same may be provided. However, the scope of the present invention is not limited thereto.

BEST MODE

Figure 1:
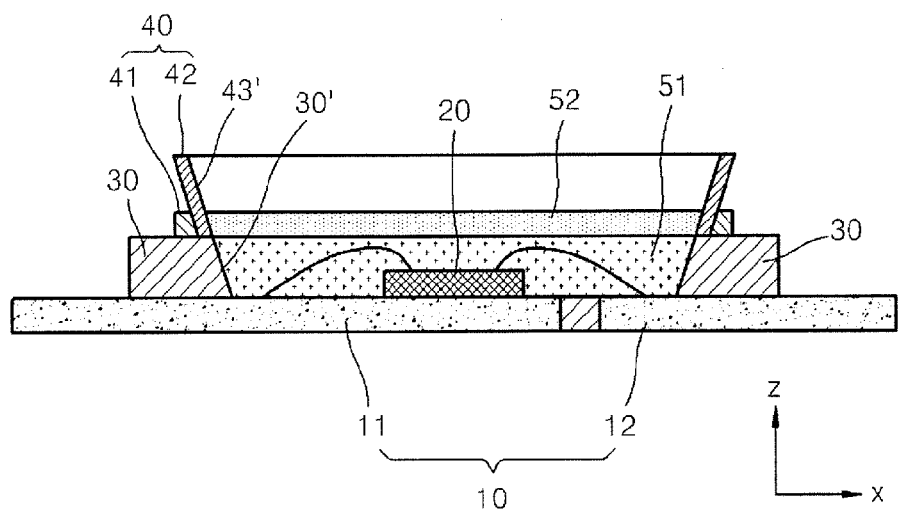
FIG. 1 is a schematic cross-sectional view of a light emitting element package according to an embodiment of the present invention.

Hereinafter, embodiments of the present invention will be described in detail with reference to the attached drawings. The present invention may, however, be embodied in many different forms and should not be construed as being limited to the embodiments set forth herein; rather, these embodiments are provided so that this disclosure will be thorough and complete, and will fully convey the concept of the invention to a person having ordinary skill in the art. In the drawings, the sizes of elements may be exaggerated or reduced for convenience of explanation.

In the following description, x, y, and z axes are not limited to three axes on a Cartesian coordinate system, and may be construed in a broad sense to include those axes. For example, the x, y, and z axes may be perpendicular to each other but may also refer to different non-perpendicular directions.

Figure 2:
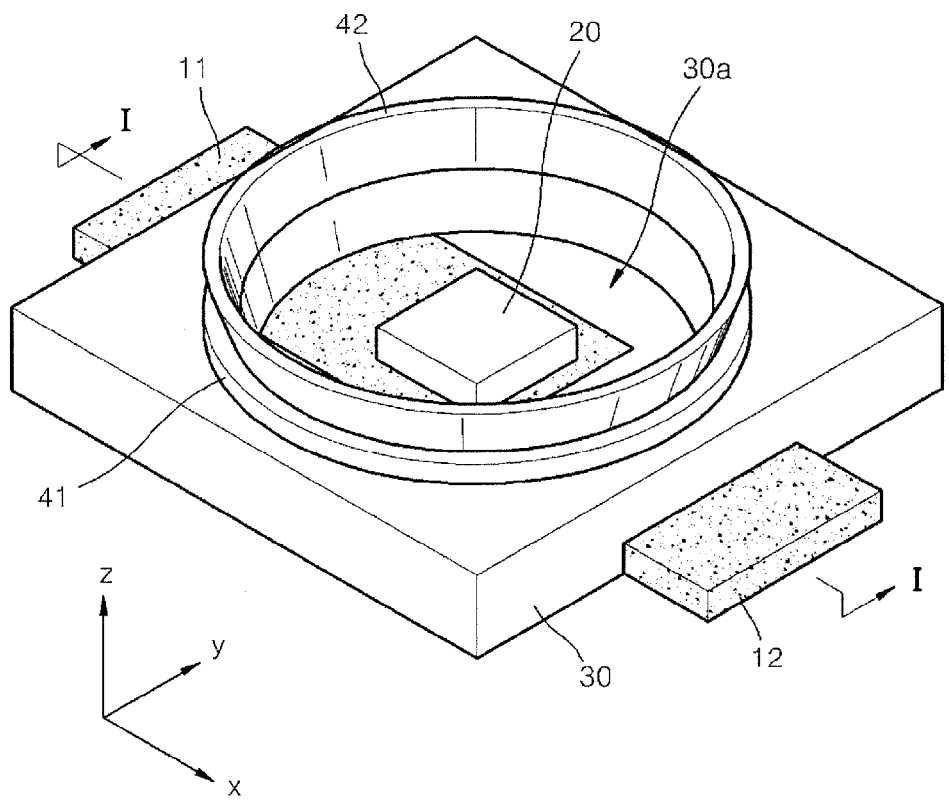
FIG. 2 is a partial schematic perspective view of the light emitting element package of FIG. 1.

FIG. 1 is a schematic cross-sectional view of a light emitting element package according to an embodiment of the present invention, and FIG. 2 is a partial schematic perspective view of the light emitting element package of FIG. 1. The cross-sectional view of FIG. 1 may be understood to be one taken along line I-I of FIG. 2. The light emitting element package according to this embodiment includes a package and a reflection structure 40 as illustrated in FIGS. 1 and 2. The package includes a lead frame 10, a light emitting element 20, and a molded material 30, and the reflection structure 40 includes a supporting portion 41 and a radial portion 42.

The lead frame 10 includes a first lead 11 and a second lead 12. The lead frame 10 may further include another lead(s). For example, the lead frame 10 may include a die pad for mounting the light emitting element 20 to be described below, and first and second leads spaced apart from the die pad.

The light emitting element 20 is provided on the lead frame 10, for example, on the first lead 11 as illustrated in FIGS. 1 and 2. The light emitting element 20 is an element for emitting light by receiving an electrical signal and may be used as a light source for various electronic devices. For example, the light emitting element include a diode of a compound semiconductor, and may be referred to as a light emitting diode (LED). The LED may emit light of various colors depending on materials of the compound semiconductor.

The light emitting element 20 may be electrically connected to the first lead 11 and/or the second lead 12, either by an electrically conductive adhesive member or to through wiring. Referring to FIG. 1, the light emitting element 20 is illustrated to be electrically connected to each of the first and second leads 11 and 12 through wiring. Wiring is not illustrated in FIG. 2.

The molded material 30 may be connected to the lead frame 10 to form an external shape of the whole light emitting element package. The molded material 30 has an opening 30a through which light generated by the light emitting element 20 passes. In FIGS. 1 and 2, the molded material 30 is illustrated to have the opening 30a capable of allowing light generated by the light emitting element 20 to proceed in the positive z direction.

The molded material 30 may be formed of a resin by, for example, transfer molding. Various modifications are possible and thus the molded material 30 may be formed by injection molding other than transfer molding. The resin for the molded material 30 may include, for example, epoxy.

A first resin layer 51 may be provided within the opening 30a of the molded material 30 such that the light emitting element 20 is covered and protected against, for example, external moisture. A fluorescent material may be mixed into the first resin layer 51 and the opening 30a of the molded material 30 may be completely or partially filled with the first resin layer 51. The opening may be partially filled with the first resin layer 51 mixed with the fluorescent material, and a (transparent) filler having no fluorescent material may be additionally provided to fill the remaining area. When the opening 30a of the molded material 30 is filled with the first resin layer 51, the opening will be filled as high as the top edge of the opening 30a of the molded material 30, that is, the bottom edge of the supporting portion 41 of the reflection structure 40, which will be described below. The first resin layer 51 is not illustrated in FIG. 2.

The reflection structure 40 has an opening that corresponds to the opening 30a of the molded material 30, and contacts the molded material 30. The reflection structure 40 may be formed of a metallic material having excellent thermal conductivity. Particularly, the reflection structure 40 may include the supporting portion 41 and the radial portion 42.

The supporting portion 41 contacts the molded material 30 and may be continuously provided along the circumference of the opening 30a of the molded material 30. The supporting portion 41 is illustrated to continuously surround the opening 30a of the molded material 30 in FIGS. 1 and 2.

The radial portion 42 is provided to contact the supporting portion 41. The radial portion 42 is illustrated to contact the supporting portion 41 and also contact a top surface of the molded material 30 in a light emitting direction (the positive z direction) in FIGS. 1 and 2, but the present invention is not limited thereto. That is, the radial portion 42 may not contact the molded material 30 but contact the supporting portion 41 only. The radial portion 42 and the supporting portion 41 may be provided as one body.

The radial portion 42 has a radial shape. Particularly, the radial portion 42 may be formed in a radial shape extending radially from the molded material relative to a direction along which light generated by the light emitting element emits (the positive z direction). The radial shape of the radial portion 42 may be formed with respect to an axis that passes through the centers of the light emitting element 20 and the opening 30a of the molded material 30 (z axis).

A second resin layer 52 may be further provided. Here, the second resin layer 52 covers the first resin layer 51 and contacts the radial portion 42. The second resin layer 52 contacting the radial portion 42 may be understood to be the second resin layer 52 contacting an internal radial surface of the radial portion 42.

The second resin layer 52 may be formed of a light-transmitting material, e.g., an epoxy or silicone resin. The second resin layer 52 contacts the first resin layer 51 and the radial portion 42 (radiation surface) and thus may prevent the reflection structure 40 from being separated from, for example, the molded material 30. The second resin layer 52 may fill the reflection structure 40 as high as the top edge of the supporting portion 41 as illustrated in FIG. 1. The second resin layer 52 is not illustrated in FIG. 2.

Although the first resin layer 51, into which a fluorescent material is mixed, is provided in the opening 30a of the molded material 30 to cover the light emitting element 20, and the second resin layer 52 is provided to cover the first resin layer 51 and contact the radial portion 42 (radiation surface) in the above description, the relative positions of the first and second resin layers 51 and 52 may be switched. For example, a light-transmitting second resin layer may be provided in the opening 30a of the molded material 30 to cover the light emitting element 20, and a first resin layer, into which a fluorescent material is mixed, may be provided to cover the second resin layer and contact the radial portion 42 (radiation surface).

Here, since the second resin layer is provided between the light emitting element 20 and the first resin layer into which the fluorescent material is mixed, the distance between the light emitting element 20 and the first resin layer into which the fluorescent material is mixed may be controlled using the second resin layer. If the distance between the light emitting element 20 and the first resin layer into which the fluorescent material is mixed decreases, the color temperature of light ultimately emitted to the outside is lowered. Consequently, the color temperature of light ultimately emitted to the outside may be controlled by adjusting the thickness of the second resin layer.

As described above, the light emitting element 20 generates not only light but also a considerable amount of heat. In a conventional light emitting element package, heat generated by a light emitting element may not be easily discharged to the outside. As a result, a molded material may inflate or the life span of the light emitting element shortened.

The light emitting element package according to the this embodiment includes the reflection structure 40, provided near the light emitting element 20 and contacting the molded material 30, and thus heat generated by the light emitting element 20 may be effectively discharged to the outside through the reflection structure 40. In particular, the radial portion 42 of the reflection structure 40 has a radial-shaped structure that is open to the outside of the molded material 30, and thus the heat generated by the light emitting element 20 and absorbed by the reflection structure 40 may be effectively discharged to the outside.

Some of the light generated by the light emitting element 20 proceeds along a direction between the positive z direction and the positive x direction, as well as along the positive z direction. The luminance in a forward direction of the light emitting element package may be greatly increased by having the above described light reflected on the internal surface 42' of the radial portion 42 of the reflection structure and then proceed approximately along the positive z direction. That is, the internal surface 42' of the radial portion 42 of the reflection structure 40 may function as a reflective surface together with a tilted side surface 30' of the opening 30a of the molded material 30.

A reflective portion may be formed only of the internal side surface 30' of the opening 30a of the molded material 30, but there may exist light that proceeds along a direction between the positive z direction and the positive x direction without reaching the internal side surface 30' of the opening 30a of the molded material 30. In the light emitting element package according to the current embodiment, the above described light may also be reflected on the internal surface 42' of the radial portion 42 provided outside the molded material 30 and then proceed approximately along the positive z direction.

The internal surface 42' of the radial portion 42 of the reflection structure 40 may be coated with a reflective material such as silver to improve reflectivity. For convenience, parts other than the internal surface 42' may also be coated.

Mode of the Invention

Figure 3:
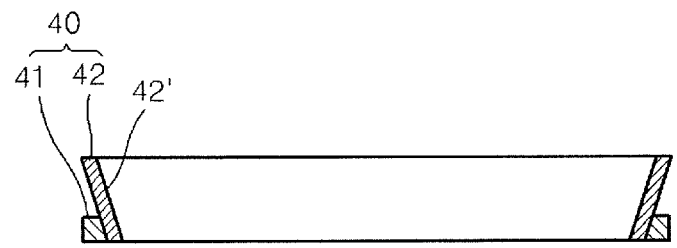
FIGS. 3 and 4 are schematic cross-sectional views showing a manufacturing method of a light emitting element package, according to another embodiment of the present invention.
Figure 3:
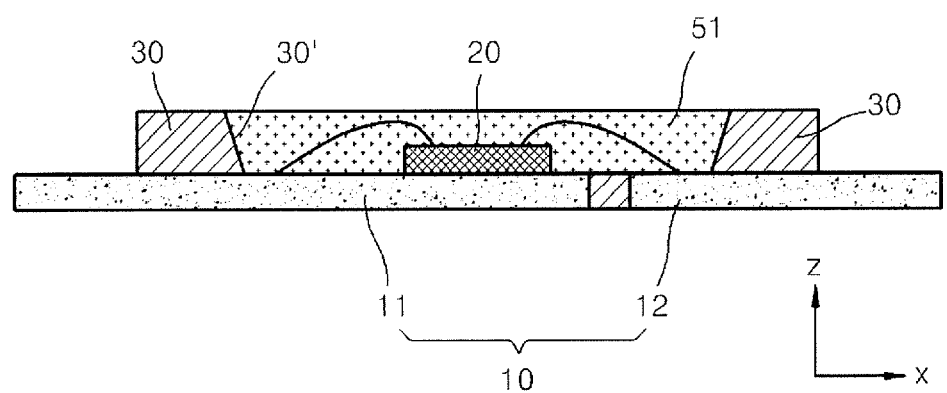
Figure 4:
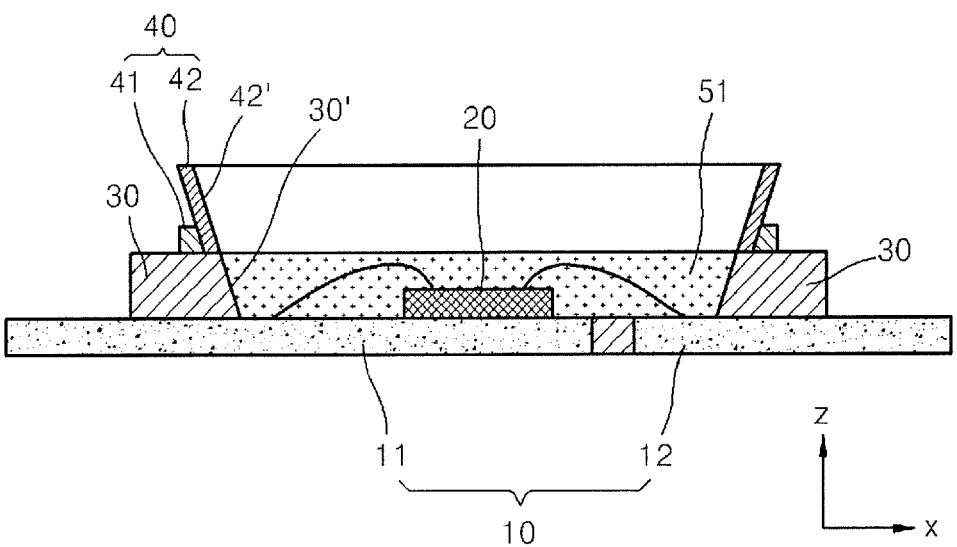

FIGS. 3 and 4 are schematic cross-sectional views showing a manufacturing method of a light emitting element package, according to another embodiment of the present invention. Referring to FIG. 3, the package that includes the lead frame 10, the light emitting element 20, and the molded material 30, and the reflection structure 40 that includes the supporting portion 41 and the radial portion 42 are prepared. The package includes the first resin layer 51 that fills the opening 30a of the molded material 30 to cover the light emitting element 20.

After that, the package and the reflection structure 40 are aligned to contact each other as illustrated in FIG. 4, and then the second resin layer 52 is formed on the first resin layer 51, thereby manufacturing the light emitting element package illustrated in FIG. 1. The second resin layer 52 may prevent the reflection structure 40 from being separated from the molded material 30.

One package and one reflection structure 40 are aligned and combined in FIGS. 3 and 4, but the present invention is not limited thereto. For example, a plurality of lead frames 10 of packages may be aligned and connected to each other, a plurality of reflection structures 40 may be aligned and connected to each other, and then the packages and the reflection structures 40 may be combined and cut, thereby simultaneously manufacturing a plurality of light emitting element packages each of which having a reflection structure. This also applies to the following embodiments and modifications thereof.

Meanwhile, as described above, the package that includes the first resin layer 51 filling the opening 30a of the molded material 30 to cover the light emitting element 20 is prepared as illustrated in FIG. 3, the package and the reflection structure 40 are aligned to contact each other as illustrated in FIG. 4, and then the second resin layer 52 is formed on the first resin layer 51, thereby manufacturing the light emitting element package illustrated in FIG. 1. However, the present invention is not limited thereto. For example, a package that includes a light-transmitting second resin layer filling the opening 30a of the molded material 30 to cover the light emitting element 20 may be prepared, the package and the reflection structure 40 may be aligned to contact each other, and then a first resin layer into which a fluorescent material is mixed may be formed on the second resin layer, thereby manufacturing a light emitting element package.

Here, since the second resin layer is provided between the light emitting element 20 and the first resin layer into which the fluorescent material is mixed, the distance between the light emitting element 20 and the first resin layer into which the fluorescent material is mixed may be controlled using the second resin layer. If the distance between the light emitting element 20 and the first resin layer into which the fluorescent material is mixed decreases, the color temperature of light ultimately emitted to the outside is lowered. Consequently, the color temperature of light ultimately emitted to the outside may be controlled by adjusting the thickness of the second resin layer.

Figure 5:
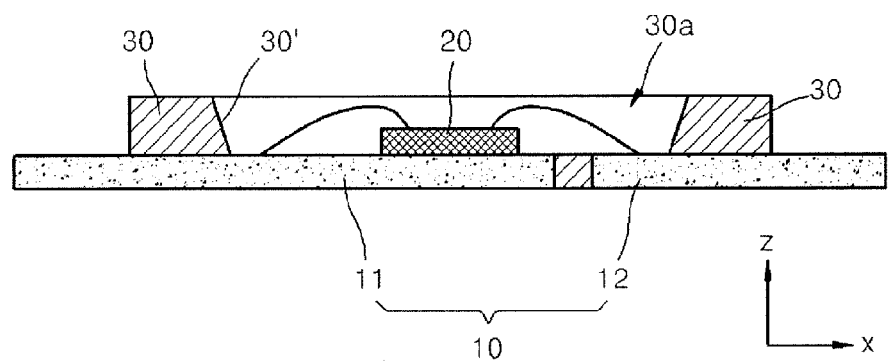
FIGS. 5 and 6 are schematic cross-sectional views showing a manufacturing method of a light emitting element package, according to yet another embodiment of the present invention.
Figure 6:
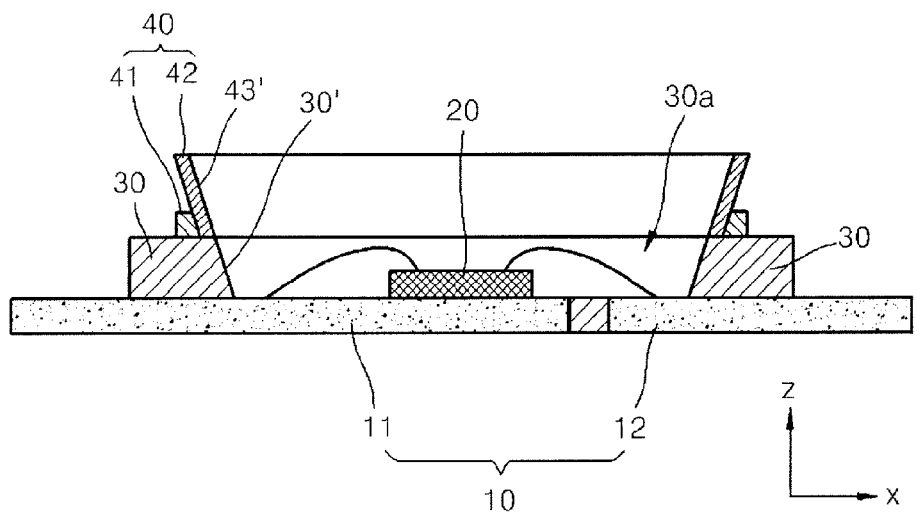

FIGS. 5 and 6 are schematic cross-sectional views showing a manufacturing method of a light emitting element package, according to yet another embodiment of the present invention. Referring to FIG. 5, the package that includes the lead frame 10, the light emitting element 20, and the molded material 30, and the reflection structure 40 that includes the supporting portion 41 and the radial portion 42 are prepared. The package does not include the first resin layer 51.

After that, the package and the reflection structure 40 are aligned to contact each other as illustrated in FIG. 6, the first resin layer 51 that fills the opening 30a of the molded material 30 to cover the light emitting element 20 is formed, and then the second resin layer 52 is formed on the first resin layer 51, thereby manufacturing the light emitting element package illustrated in FIG. 1. The second resin layer 52 may prevent the reflection structure 40 from being separated from the molded material 30.

However, unlike this, after the package and the reflection structure 40 are aligned to contact each other as illustrated in FIG. 6, the first resin layer 51, into which a fluorescent material is mixed, may not only fill the opening 30a of the molded material 30 to cover the light emitting element 20 but also contact the reflection structure 40, without a second resin layer being formed. Here, the first resin layer 51 may contact part of the radial portion 42, or may completely fill the opening of the radial portion 42 lest the internal surface 42' of the radial portion 42 is exposed.

Alternatively, after the package and the reflection structure 40 are aligned to contact each other as illustrated in FIG. 6, a second resin layer may fill the opening 30a of the molded material 30 to cover the light emitting element 20, and then a first resin layer into which a fluorescent material is mixed may be formed on the second resin layer. Here, the second resin layer may not contact the reflection structure 40 and the first resin layer may contact the reflection structure 40, or the second resin layer may contact the reflection structure 40 and the first resin layer thereon may also contact the reflection structure 40.

Heretofore, the reflection structure has been illustrated to include a supporting portion and a radial portion, but the present invention is not limited thereto. That is, the supporting portion may be part of a molded material and the reflection structure may include the radial portion only. For example, the supporting portion continuously or discretely disposed along the circumference of an opening of the molded material may be one of the components of the molded material. Furthermore, the reflection structure may include the radial portion contacting the supporting portion of the molded material and formed in a radial shape extending radially from the molded material relative to a direction along which light generated by the light emitting element emits.

Figure 7:
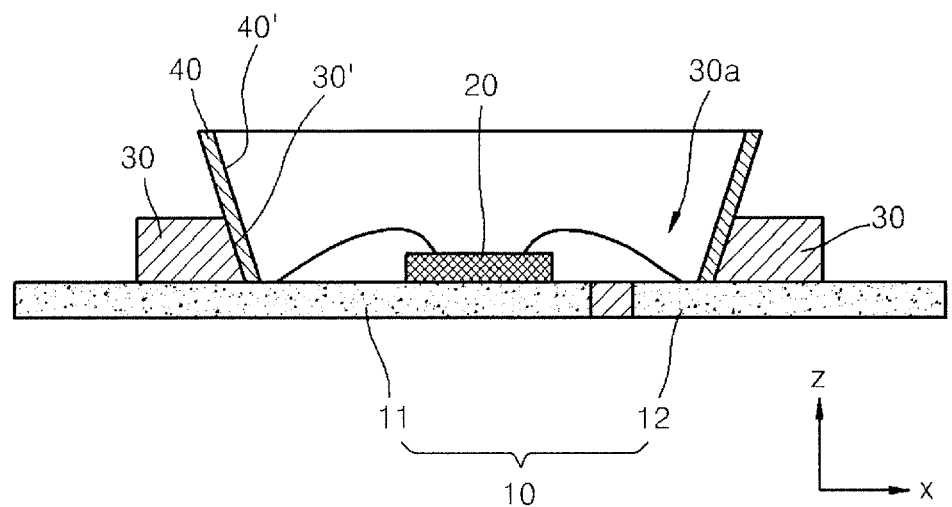
FIGS. 7 and 8 are schematic cross-sectional views showing a manufacturing method of a light emitting element package, according to yet another embodiment of the present invention.
Figure 8:
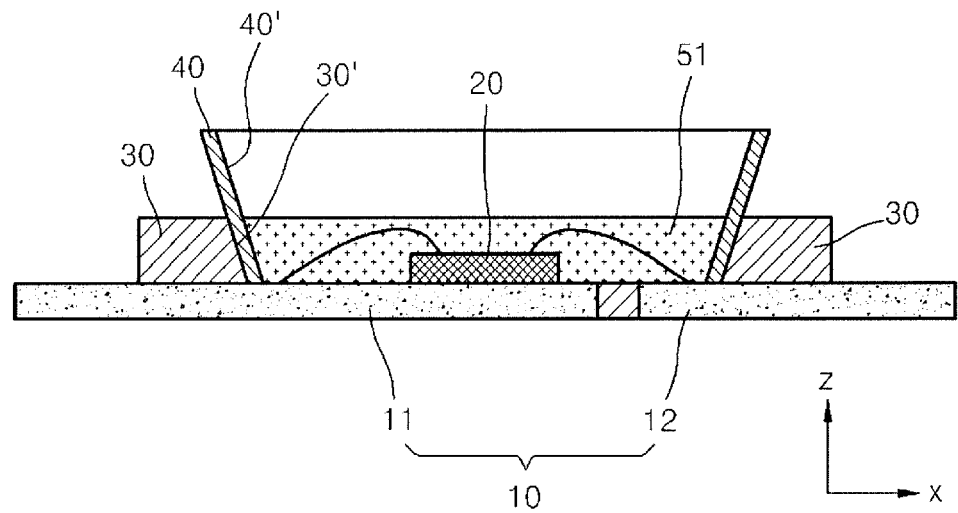

FIGS. 7 and 8 are schematic cross-sectional views showing a manufacturing method of a light emitting element package, according to yet another embodiment of the present invention. In this embodiment, a structure wherein the package and the reflection structure 40 are combined is firstly prepared as illustrated in FIG. 7.

Here, the reflection structure 40 has a shape different from that of the reflection structure according to the preceding embodiments. In the manufacturing process according to this embodiment, part of the reflection structure 40 may be inserted into the opening 30a of the molded material 30, and the other part of the reflection structure 40, protruding from the opening 30a of the molded material 30, may be formed in a radial shape extending radially from the molded material relative to a direction along which light generated by the light emitting element 20 emits. That is, unlike the preceding embodiments, the supporting portion 41 may not be provided.

Particularly, the part of the reflection structure 40, which is inserted into the opening 30a of the molded material 30, may contact an internal surface 30' of the opening 30a of the molded material 30, and may extend to a bottom surface of the opening 30a of the molded material 30 to contact the bottom surface (the first lead 11 or the second lead 12) as illustrated in FIGS. 7 and 8. Alternatively, the reflection structure 40 may not extend to the bottom surface of the opening 30a of the molded material 30 and may cover only part of the internal surface 30' of the opening 30a. Including the above, various modifications of this embodiment are possible.

After the structure wherein the package and the reflection structure 40 are combined is prepared as described above, the first resin layer 51 is formed to cover the light emitting element 20 as illustrated in FIG. 8. A fluorescent material may be mixed into the first resin layer 51. The first resin layer 51 may be cured and prevent the reflection structure 40 from being separated from the molded material 30. A light-transmitting second resin layer may be provided on the first resin layer 51, if necessary.

Unlike the above, after the structure wherein the package and the reflection structure 40 are combined is prepared as illustrated in FIG. 7, the first resin layer 51 into which the fluorescent material is mixed may not only fill the opening of the molded material 30 to cover the light emitting element 20 but also be formed such that a top surface of the first resin layer 51 is higher than that of the molded material 30, without a second resin layer being formed.

Alternatively, after the structure wherein the package and the reflection structure 40 are combined is prepared as illustrated in FIG. 7, a second resin layer may fill the opening 30a of the molded material 30 to cover the light emitting element 20, and then a first resin layer into which a fluorescent material is mixed may be formed on the second resin layer.

The light emitting element package illustrated in FIG. 8 may be understood to be a light emitting element package according to yet another embodiment of the present invention.

Meanwhile, in the light emitting element package illustrated in FIG. 8, since the reflection structure 40 contacts the first and second leads 11 and 12, the first and second leads 11 and 12 need to be insulated from each other. Accordingly, the reflection structure 40 may have a radial shape and be divided into at least two parts spaced apart from each other. A first part of the reflection structure 40, which contacts the first lead 11, and a second part of the reflection structure 40, which contacts the second lead 12, may be spaced apart from each other, and have an insulating material filled therebetween.

Figure 9:
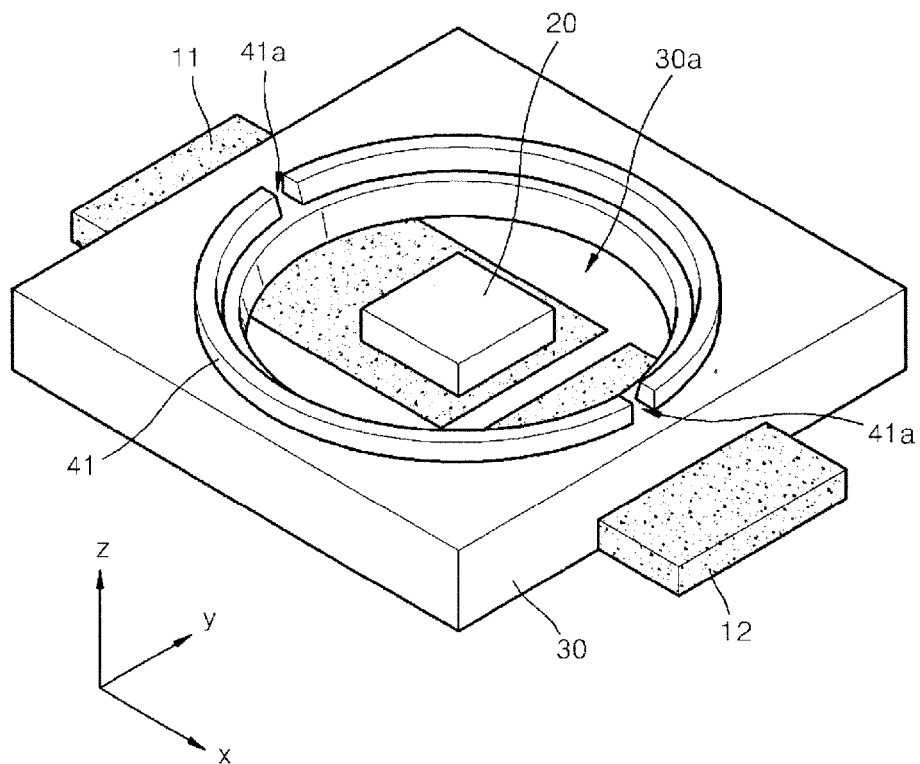
FIG. 9 is a partial schematic perspective view of a light emitting element package according to yet another embodiment of the present invention.

FIG. 9 is a partial schematic perspective view of a light emitting element package according to yet another embodiment of the present invention. Like the light emitting element package described above with reference to FIG. 1, etc., in the light emitting element package according to this embodiment, the reflection structure 40 includes the supporting portion 41 and a radial portion (not shown).

The difference is that the supporting portion 41 contacts the molded material 30 but is provided not continuously but discretely along the circumference of the opening 30a of the molded material 30. That is, the supporting portion 41 has discontinuous parts 41a. Two discontinuous parts 41a are illustrated in FIG. 9, but the number of the discontinuous parts 41a may vary and the width of the discontinuous parts 41a may be greater than that illustrated in FIG. 9.

Since the supporting portion 41 serves to support the radial portion (not shown), even when the supporting portion 41 has the discontinuous parts 41a, manufacturing costs may be reduced, without deteriorating heat radiation function and forward direction luminance.

Alternatively, a supporting portion may not be part of the reflection structure 40. That is, the supporting portion may be part of the molded material 30, and the reflection structure 40 may have the radial portion only. Even here, the supporting portion, which is part of the molded material 30, may be provided not continuously but discretely along the circumference of the opening 30a of the molded material 30.

Figure 10:
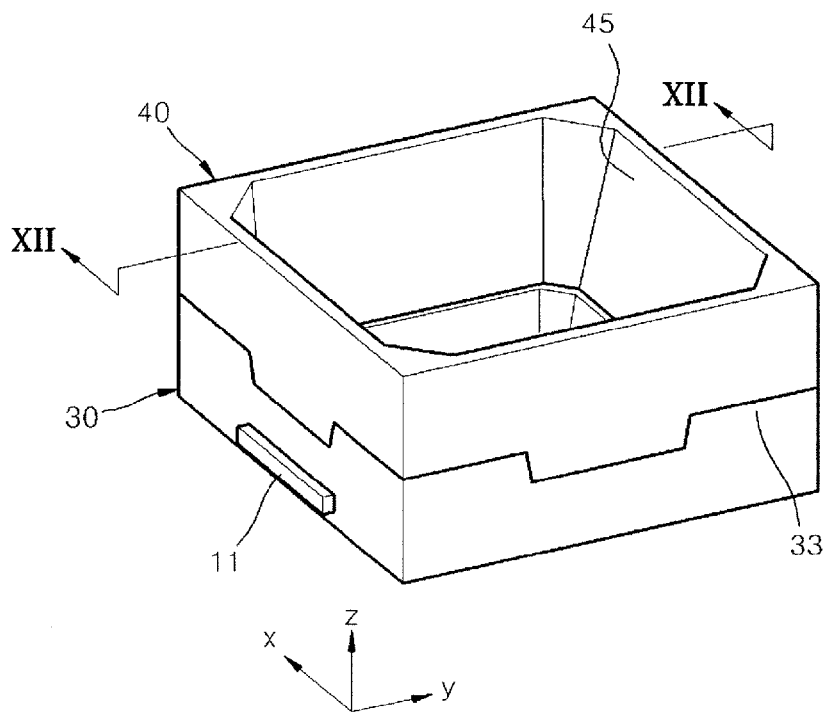
FIG. 10 is a schematic perspective view of a light emitting element package according to yet another embodiment of the present invention.
Figure 11:
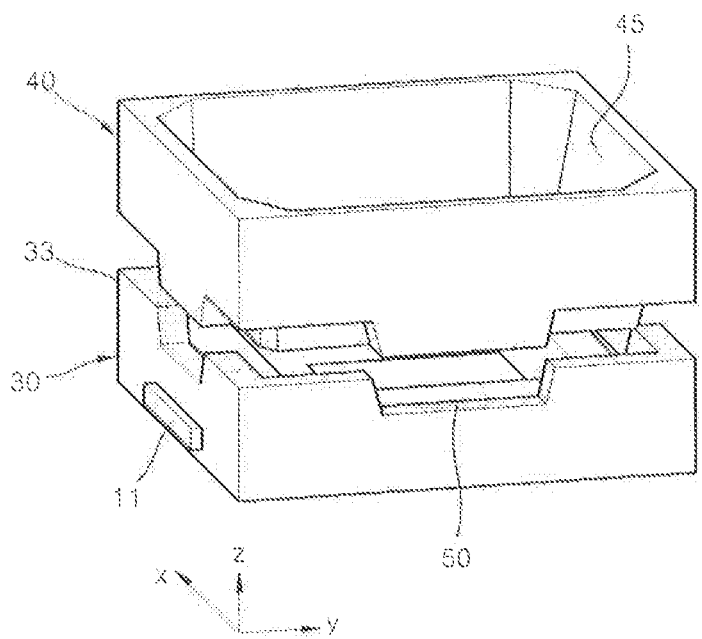
FIG. 11 is an exploded perspective view of the light emitting element package of FIG. 10.
Figure 12:
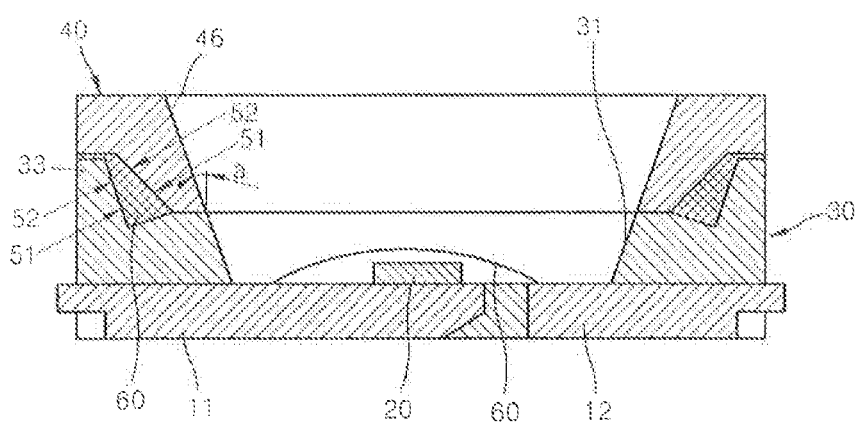
FIG. 12 is a schematic cross-sectional view taken along line XII-XII of FIG. 10.

FIG. 10 is a schematic perspective view of a light emitting element package according to yet another embodiment of the present invention, and FIG. 11 is an exploded perspective view of the light emitting element package of FIG. 10. FIG. 12 is a schematic cross-sectional view taken along line XII-XII of FIG. 10.

The light emitting element package according to this embodiment may include a lead frame, a light emitting element 20, a molded material 30, and a reflection structure 40, as illustrated in FIGS. 10 to 12.

The molded material 30 may include a supporting portion 33 provided continuously or discretely along the circumference of the opening 30a. Particularly, the supporting portion 33 may be provided adjacent to the exterior part of the opening 30a along the circumference of the opening 30a. The supporting portion 33 is illustrated to discretely surround the opening 30a of the molded material 30 in FIGS. 10 to 12. However, the supporting portion 33 is not limited thereto and may continuously surround the opening 30a of the molded material 30 as described in the preceding embodiments. If the supporting portion 33 discretely surrounds the opening 30a of the molded material 30 as illustrated in FIGS. 10 to 12, this may be understood to be that recesses or concave and convex portions are formed in the molded material 30.

For example, if the molded material 30 has an almost rectangular parallelepiped shape, the opening 30a may be formed in the center of a top surface of the molded material 30, and the light emitting element 20 may be mounted at the central part of the opening 30a. As illustrated in FIGS. 10 to 12, the supporting portion 33 may extend along the circumference of the opening 30a of the molded material 30 and protrude from corners of the molded material 30 along the positive z direction.

Here, a surface of the supporting portion 33, facing the opening 30a of the molded material 30 may be formed in a radial shape extending radially relative to a direction along which light generated by the light emitting element 20 emits (e.g., the positive z direction). Particularly, the supporting portion 33 may have an internal surface that has a downward inclination with respect to the opening 30a of the molded material 30. This allows the supporting portion 33 to more stably support the reflection structure 40 that will be is described below. This also allows the supporting portion 33 to more accurately guide or define a location wherein the reflection structure 40 is combined.

A resin layer 60 may be provided on the light emitting element 20 in the opening 30a of the molded material 30 to cover the light emitting element 20 so as to protect the light emitting element 20 from, for example, external moisture. A fluorescent material may be mixed into the resin layer 60 and the opening 30a of the molded material 30 may be completely or partially filled with the resin layer 60. The opening may be partially filled with the resin layer 60 into which the fluorescent material is mixed, and a (transparent) filler having no fluorescent material may be additionally provided to fill the remaining area. The resin layer 60 or the filler may be fill not only the opening 30a of the molded material 30 but also fill the reflection structure 40 to a bottom end or a top end, which will be described below.

The reflection structure 40 has an opening that corresponds to the opening 30a of the molded material 30 and may contact the molded material 30. As described above, if the supporting portion 33 discretely surrounds the opening 30a of the molded material 30, that is, if it is understood that recesses or concave and convex portions are formed in the molded material 30, the reflection structure 40 may be fitted into the recesses or concave and convex portions. The reflection structure 40 may include a metal having excellent thermal conductivity. The reflection structure 40 may also include a radial surface 45 formed in a radial shape extending radially from the molded material relative to a direction along which light generated by the light emitting element 20 emits.

When it comes to the role of the reflection structure 40, the reflection structure 40 may be configured to reflect light emitted by the light emitting element 20 such that the light proceeds approximately along the positive z direction. Particularly, since some of the light generated by the light emitting element 20 proceeds between the positive z direction and the positive y direction, as well as along the positive z direction The luminance in a forward direction of the light emitting element package may be greatly increased and a beam angle of the light emitted by the light emitting element package may be narrowed by having the above described light reflected on the radial surface 45 of the reflection structure 40 and then proceed approximately along the positive z direction. That is, the radial surface 45 of the reflection structure 40 together with a inclined internal side surface of the opening 30*a* of the molded material 30 may function as a reflective surface.

A reflective portion may be formed only of the internal side surface of the opening 30*a* of the molded material 30, but there may exist light that proceeds along a direction between the positive z direction and the positive y direction without reaching the internal side surface of the opening 30*a* of the molded material 30. In the light emitting element package according to this embodiment, the above described light may also be reflected on the radial surface 45 provided outside the molded material 30 and then proceed approximately along the positive z direction.

The cross-section of the radial surface 45 of the reflection structure 40 may be flat or bent. For example, referring to FIG. 12, the cross-section of the radial surface 45 of the reflection structure 40 may be flat. That is, the radial surface 45 of the reflection structure 40 may form a predetermined angle a with a main emission direction along which light generated by the light emitting element 20 emits. Here, the main emission direction refers to the positive z direction. Here, the predetermined angle a may be equal to or greater than 10° and equal to or less than 20°.

Figure 13:
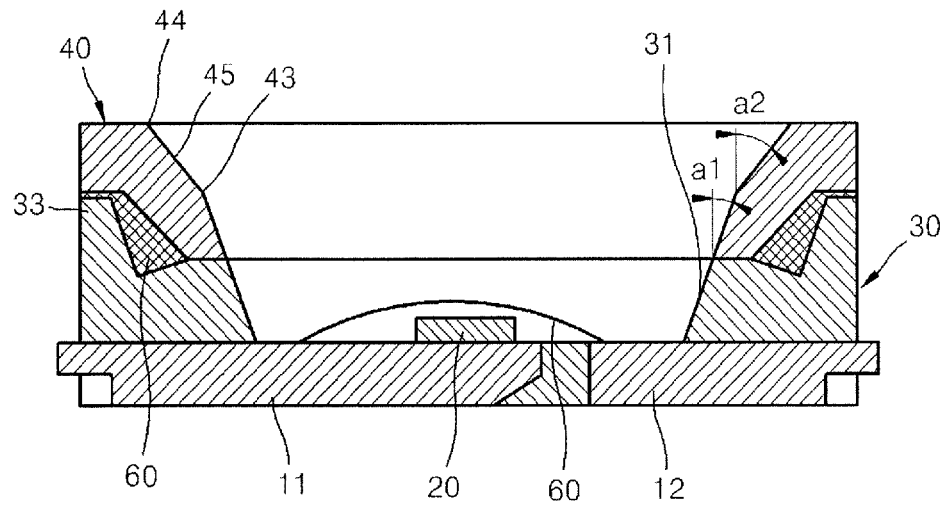
FIG. 13 is a schematic cross-sectional view of a light emitting element package according to yet another embodiment of the present invention.

Meanwhile, FIG. 13 is a schematic cross-sectional view of a light emitting element package according to yet another embodiment of the present invention. FIG. 13 is a cross-sectional view of the light emitting element package according to the present invention, taken along a line located similar to the line XII-XII of FIG. 10.

Referring to FIG. 13, the radial surface 45 of the reflection structure 40 may form a first angle a1 with the positive z direction from a point where the radial surface contacts the molded material 30 to a first point 43 away from the molded material 30, and form a second angle a2 from the first point 43 to a second point 44 further away from the molded material 30 compared to the first point 43. Here, the second angle a2 may be greater than the first angle a1. Particularly, the first angle a1 may be about 10° and the second angle a2 may be about 20°.

Here, the second point 44 may be, for example, an end portion of the reflection structure 40. That is, the first point 43 may be a certain point between two end portions of an internal surface of the reflection structure 40, located along the positive z direction, i.e., between an end portion along a direction toward the molded material 30 (the negative z direction) and an end portion along an emission direction of light (the positive z direction). In addition, each of the first and second points 43 and 44 may be continuously provided along the circumference of the opening 30*a* of the molded material 30 to form an encircling line.

Since the radial surface 45 is inclined by the predetermined angle a as described above, light emitted from the light emitting element 20 may be radiated onto the radial surface 45. Accordingly, a beam angle of light emitted from the light emitting element package may be narrowed. The radial surface 45 of the reflection structure 40 may be coated with a reflective material such as silver to improve reflectivity. For convenience, portions other than the radial surface 45 may also be coated.

The reflection structure 40 may have a shape that corresponds to the supporting portion 33, thereby contacting the molded material 30. For example, if the supporting portion 33 is continuously provided, the reflection structure 40 may also have a continuous shape that corresponds to the shape of the supporting portion 33. Another example would be that if the supporting portion 33 is discretely provided as illustrated in FIGS. 10 and 11, the reflection structure 40 may also have a discrete shape to be inserted between the supporting portions 33.

Figure 14:
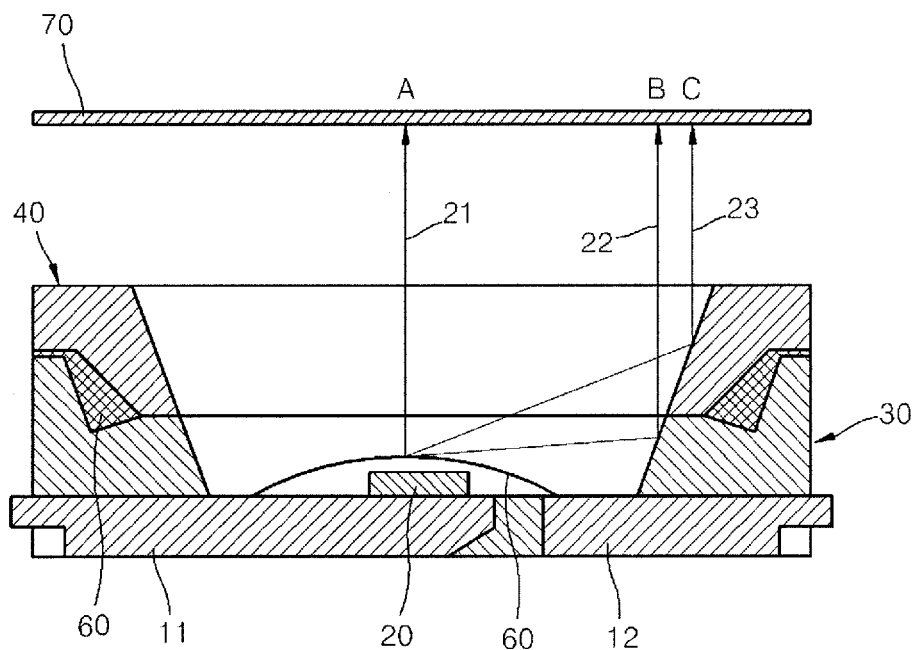
FIG. 14 is a schematic cross-sectional view showing paths of as well as surfaces illuminated by light emitted from the light emitting element package according to embodiments of the present invention.

FIG. 14 is a schematic cross-sectional view showing paths of light emitted from the light emitting element package according to embodiments of the present invention. Although FIG. 14 schematically illustrates paths of light emitted from the light emitting element package illustrated in FIG. 12, the paths of light may be equally or similarly applied to the light emitting element package illustrated in FIG. 13.

Referring to FIG. 14, light emitted from the light emitting element 20 may directly reach area A of a illuminated surface 70 along a first path 21, reach area B of the illuminated surface 70 after being reflected on the molded material 30 along a second path 22, and reach area C of the illuminated surface 70 after being reflected on the reflection structure 40 along a third path 23.

Here, if the reflection structure 40 and the molded material 30 have the same reflectivity, the luminance of area A may be the highest, the luminance of area B may be the second highest, and the luminance of area C may be the lowest. That is, the luminance is lowered away from an optical axis. In particular, the luminance may be greatly lowered from area B to area C.

However, according to the embodiments of the present invention, the reflection structure 40 may have a higher reflectivity than that of the molded material 30. For example, as described above, the reflection structure 40 may include a metal and thus have a higher reflectivity than that of the molded material 30 that is formed of a resin material. Accordingly, the luminance of light projected onto area C along the third path 23 may increase compared to a conventional way due to the high reflectivity of the reflection structure 40. Therefore, the luminance may not be rapidly reduced but gradually reduced from area A to area C and, particularly, the change in the luminance may be gradual or almost no change may occur from area B to area C. As such, light having an almost uniform luminance may be effectively projected onto the whole illuminated surface 70.

Figure 15:
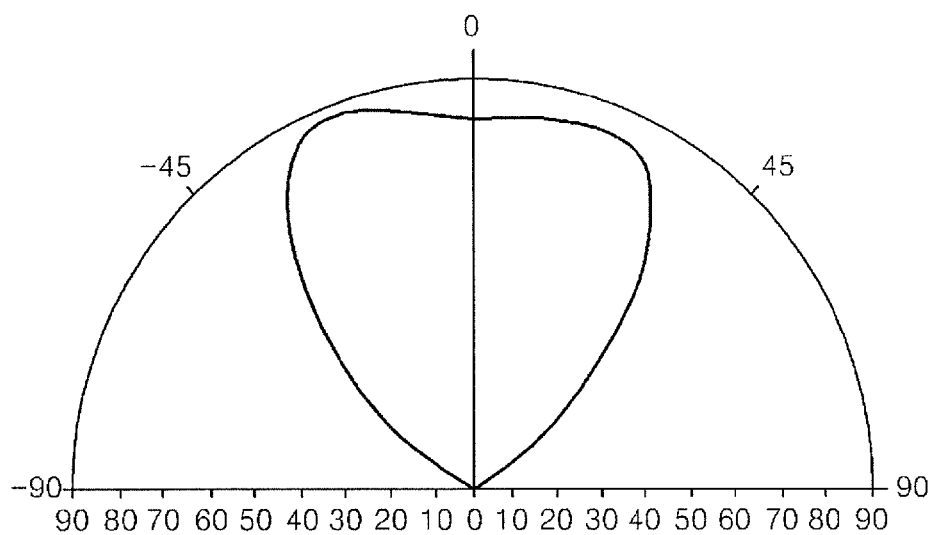
FIG. 15 is a schematic graph showing a beam angle of light emitted from the light emitting element package according to embodiments of the present invention.

FIG. 15 is a schematic graph showing a beam angle of light emitted from the light emitting element package according to embodiments of the present invention.

A conventional light emitting element package has a peak of optical power in an optical axis direction, and emits light in such a manner that the optical power is not rapidly but gradually reduced as an angle with the optical axis is increased. Furthermore, due to a large beam angle, the conventional light emitting element package has a small amount of reduction in optical power even considerably far away from an optical axis, and thus is used for lighting by having an overall luminance of light emitted from a light emitting element package be gradually reduced over a wide range.

According to embodiments of the present invention, however, as shown in FIG. 15, light emitted from the light emitting element 20 may be reflected by the reflection structure 40 and thus the optical power near an optical axis may be almost uniform even away from the optical axis. Furthermore, the luminance of an illuminated area may be increased by narrowing a beam angle. Thus, light emitted from the light emitting element package may have a uniform and high luminance near the optical axis even away from the optical axis. As such, when the light emitting element package is used as a flash for a mobile phone, a camera, etc., light having a high and uniform luminance may be effectively projected onto a whole area to be photographed. That is, the above-described optical lenses are for a flash and may be combined with the light emitting element package to effectively project light having a uniform intensity onto an illuminated area.

Figure 16:
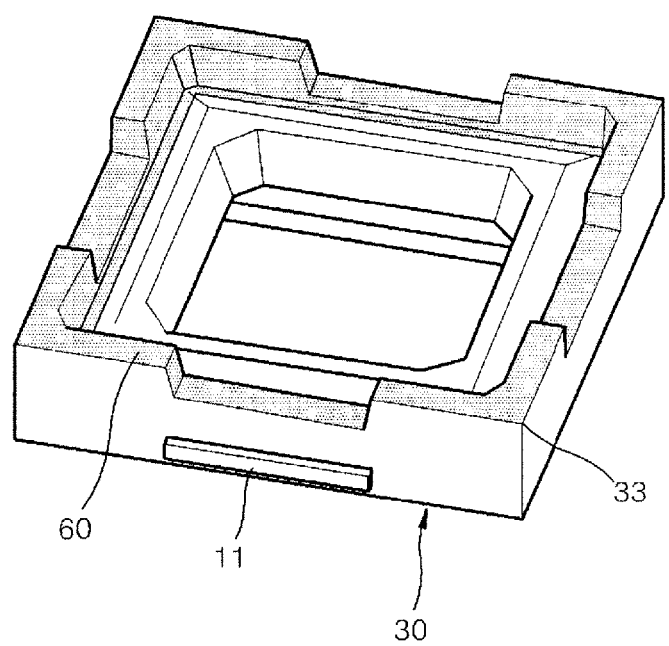
FIG. 16 is a partial schematic perspective view of a light emitting element according to yet another embodiment of the present invention.

FIG. 16 is a partial schematic perspective view of a light emitting element package according to yet another embodiment of the present invention. Hereinafter, an adhesive layer 60 will be described with reference to FIGS. 12, 13, and 16. The adhesive layer 60 may be provided at least part of a region between the molded material 30 and the reflection structure 40 to fix the reflection structure 40 onto the molded material 30.

The adhesive layer 60 may be provided between the supporting portion 33 of the molded material 30 and the reflection structure 40 as illustrated in FIG. 12. That is, it would be preferable that an exposed portion of the adhesive layer 60 is minimized and, due to a low reflectivity of light, the adhesive layer 60 may not be exposed between the radiation surface 45 of the reflection structure 40 and the opening 30a of the molded material 30. Accordingly, as illustrated in FIGS. 12 and 13, the adhesive layer 60 may be provided between the supporting portion 33 and the reflection structure 40, and may not be provided between the reflection structure 40 and part of the molded material 30 that is adjacent to the opening 30a.

Referring to FIG. 12, the thickness of the adhesive layer 60 may vary according to locations, to maximize adhesive force while minimizing the amount of the adhesive layer. Particularly, a first thickness 51 in an area adjacent to the light emitting element 20 may be greater than a second thickness 52 in an area away from the light emitting element 20. Here, the thickness of the adhesive layer 60 may be gradually reduced away from the light emitting element 20.

Generally, heat is generated from the light emitting element 20 in the light emitting element package and areas adjacent to the light emitting element 20 is greatly influenced by heat generated from the light emitting element 20. Accordingly, the adhesive layer 60 may have a sufficiently large thickness in areas adjacent to the light emitting element 20, thereby ensuring a strong adhesion between the molded material 30 and the reflection structure 40, and have a reduced thickness in areas away from the light emitting element 20, thereby reducing the amount of material used to manufacture the light emitting element package and manufacturing costs.

Meanwhile, according to another embodiment of the present invention, a light emitting element package may include a lead frame, a light emitting element 20, a molded material 30, a reflection structure 40, and an adhesive layer 60. The light emitting element package according to this embodiment is the same as or similar to the light emitting element package according to the preceding embodiments. Thus, repeated description thereof will be omitted.

The molded material 30 may be combined with the lead frame and have the opening 30a for emitting light generated by the light emitting element 20. That is, unlike the molded material 30 according to the preceding embodiments, the molded material 30 according to this embodiment may not include the supporting portion 33.

The reflection structure 40 may have an opening that corresponds to the opening 30a of the molded material 30, and contact the molded material 30. The reflection to structure 40 according to this embodiment is the same as or similar to the reflection structure 40 according to the preceding embodiments, but may optionally have a shape that corresponds to the supporting portion 33.

The adhesive layer 60 may be provided at least partly between the molded material 30 and the reflection structure 40 to fix the reflection structure 40 onto the molded material 30. The first thickness 51 of the adhesive layer 60 in areas adjacent to the light emitting element 20 may be greater than the second thickness 52 of the adhesive layer 60 in areas away from the light emitting element 20. The adhesive layer 60 according to this embodiment is the same as or similar to the adhesive layer 60 according to the preceding embodiments, and thus a detailed description thereof will be omitted. The adhesive layer 60 is used to maintain adhesive force.

Figure 17:
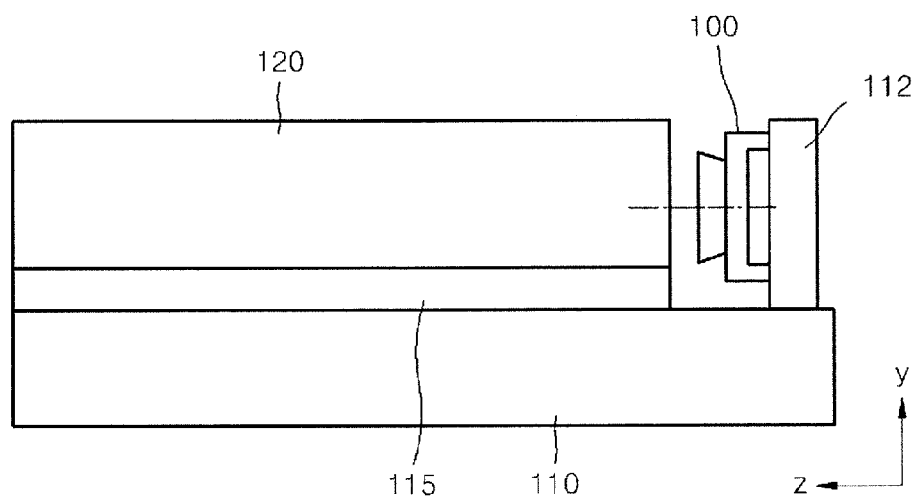
FIG. 17 is a schematic side elevation view of a backlight unit according to an embodiment of the present invention.

FIG. 17 is a schematic side elevation view of a backlight unit according to an embodiment of the present invention.

As illustrated in FIG. 17, the backlight unit according to this embodiment includes a frame 110, a reflective sheet 115 on part of the frame 110, a light guide plate 120 on the reflective sheet 115, and a light emitting element package 100 on other part of the frame 110 and configured to illuminate the light guide plate 120. The light emitting element package 100 may be any one of the light emitting element packages according to the preceding embodiments and modifications thereof. The light emitting element package 100 may be connected to a printed circuit board 112.

According to his embodiment, since the light emitting element package 100 included in the backlight unit has improved heat radiation function and forward direction luminance, the whole backlight unit may have improved heat radiation function and improved luminance of emitted light.

Although the light emitting element package 100 is illustrated to be provided on a side surface of the light guide plate 120 in FIG. 17, the present invention is not limited thereto and but applicable to a direct-type backlight unit in which a light guide plate is provided on or above a reflective sheet and a light emitting element package is provided under or below the light guide plate.

While the present invention has been described with reference to embodiments illustrated in the drawings, it will be understood by those of ordinary skill in the art that various changes in form and details may be made without departing from the spirit and scope of the present invention as as set forth in the following claims.

INDUSTRIAL APPLICABILITY

The present invention may be used to manufacture a light emitting element package having excellent heat radiation performance and high luminance, and a backlight unit including the same.

The invention claimed is:

1. A light emitting element package, comprising:
   a lead frame;
   a light emitting element on the lead frame;
   a molded material combined with the lead frame and having an opening for emitting light generated by the light emitting element;
   a reflection structure having an opening that corresponds to the opening of the molded material and contacting the molded material; and
   an adhesive layer provided in at least part of a region between the molded material and the reflection structure to fix the reflection structure onto the molded material,
   wherein the adhesive layer has a first thickness in an area adjacent to the light emitting element and a second thickness in an area away from the light emitting element, and wherein the first thickness is greater than the second thickness.

2. The light emitting element package according to claim 1, wherein the reflection structure comprises:
   a supporting portion contacting the molded material and provided continuously or discretely along a circumference of the opening of the molded material; and a radial portion contacting the supporting portion and extending radially from the molded material relative to a direction along which light generated by the light emitting element emits.

3. The light emitting element package according to claim 1, wherein the molded material comprises a supporting portion provided continuously or discretely along a circumference of the opening of the molded material, and
wherein the reflection structure comprises a radial portion contacting the supporting portion and having a radial shape extending radially from the molded material relative to a direction along which light generated by the light emitting element emits.

4. The light emitting element package according to claim 1, wherein the molded material comprises a supporting portion provided continuously or discretely along a circumference of the opening of the molded material, and
wherein the reflection structure has a shape that corresponds to the supporting portion of the molded material, and contacts the molded material.

5. The light emitting element package according to claim 1, wherein recesses or concave and convex portions are provided on the molded material, and
wherein the reflection structure is fitted into the recesses or concave and convex portions.

6. The light emitting element package according to claim 1, wherein the thickness of the adhesive layer is gradually reduced away from the light emitting element.

7. A light emitting element package, comprising:
a lead frame;
a light emitting element on the lead frame;
a molded material combined with the lead frame and having an opening for emitting light generated by the light emitting element; and
a reflection structure having an opening that corresponds to the opening of the molded material and contacting the molded material,
wherein the reflection structure comprises a radial surface formed in a radial shape extending radially from the molded material relative to a direction along which light generated by the light emitting element emits, and
wherein the radial surface of the reflection structure forms a first angle with a main emission direction of light generated by the light emitting element, from a point where the radial surface contacts the molded material to a first point away from the molded material, and forms a second angle with the main emission direction from the first point to a second point further away from the molded material compared to the first point, wherein the second angle is greater than the first angle.

8. The light emitting element package according to claim 7, further comprising a first resin layer that includes a fluorescent material and is provided in the opening of the molded material to cover the light emitting element.

9. The light emitting element package according to claim 8, further comprising a light-transmitting second resin layer that covers the first resin layer and contacts the radial surface.

10. The light emitting element package according to claim 7, further comprising:
a light-transmitting second resin layer provided in the opening of the molded material to cover the light emitting element; and
a first resin layer that includes a fluorescent material, covers the second resin layer, and contacts the radial surface.

11. The light emitting element package according to claim 1, wherein the reflection structure comprises metal.

12. The light emitting element package according to claim 1, wherein a surface of the supporting portion facing the opening of the molded material has a radial shape extending radially relative to a direction along which light generated by the light emitting element emits.

13. The light emitting element package according to claim 1, wherein part of the reflection structure is inserted into the opening of the molded material, and
Wherein the other part of the reflection structure, protruding from the opening of the molded material has a radial shape extending radially from the molded material relative to a direction along which light generated by the light emitting element emits.

14. A light emitting element package, comprising:
a lead frame;
a light emitting element on the lead frame;
a molded material combined with the lead frame and having an opening for emitting light generated by the light emitting element;
a reflection structure having an opening that corresponds to the opening of the molded material, and contacting the molded material;
a supporting portion provided discretely or continuously on the molded material to fix the reflection structure onto the molded material; and
an adhesive layer provided in at least part of a region between the molded material and the reflection structure, and having a first thickness in an area adjacent to the light emitting element and a second thickness in an area away from the light emitting element, wherein the first thickness is greater than the second thickness.

15. A backlight unit, comprising:
a reflective sheet;
a light guide plate on or above the reflective sheet; and
alight emitting element package according to claim 1, configured to illuminate the light guide plate.

* * * * *